United States Patent [19]

Hashimoto et al.

[11] Patent Number: 5,119,202
[45] Date of Patent: Jun. 2, 1992

[54] SCAN CIRCUIT WITH BOOTSTRAP DRIVE

[75] Inventors: Seiji Hashimoto, Yokohama; Tadanori Harada, Tokorozawa, both of Japan

[73] Assignee: Canon Kabushiki Kaisha, Tokyo, Japan

[21] Appl. No.: 476,528

[22] Filed: Feb. 7, 1990

Related U.S. Application Data

[62] Division of Ser. No. 196,479, May 20, 1988, Pat. No. 4,922,138.

Foreign Application Priority Data

May 25, 1987 [JP] Japan .................. 62-125925
May 25, 1987 [JP] Japan .................. 62-125926

[51] Int. Cl.⁵ ............................. H04N 5/335
[52] U.S. Cl. .................... 358/213.11; 358/213.22
[58] Field of Search ............. 358/213.11, 213.22, 358/213.29, 213.26, 213.27, 213.28, 209

[56] References Cited

U.S. PATENT DOCUMENTS

| | | | |
|---|---|---|---|
| 4,212,034 | 7/1980 | Kokie et al. | 358/213.22 |
| 4,571,625 | 2/1986 | Boudewijns | 358/213.22 |
| 4,866,292 | 9/1989 | Takemoto et al. | 358/213.22 |

FOREIGN PATENT DOCUMENTS 6161586 3/1986 Japan .

Primary Examiner—James J. Groody
Assistant Examiner—Tuan V. Ho
Attorney, Agent, or Firm—Fitzpatrick, Cella, Harper & Scinto

[57] ABSTRACT

There is provided a scan circuit in which a plurality of unit circuits are connected and scan pulses are sequentially output from the unit circuits in response to drive pulses. In this circuit, the potential at an output terminal of the unit circuit is raised by one drive pulse. The potential at the output terminal is further increased by use of the bootstrap effect by the other drive pulse, thereby forming a scan pulse.

9 Claims, 9 Drawing Sheets

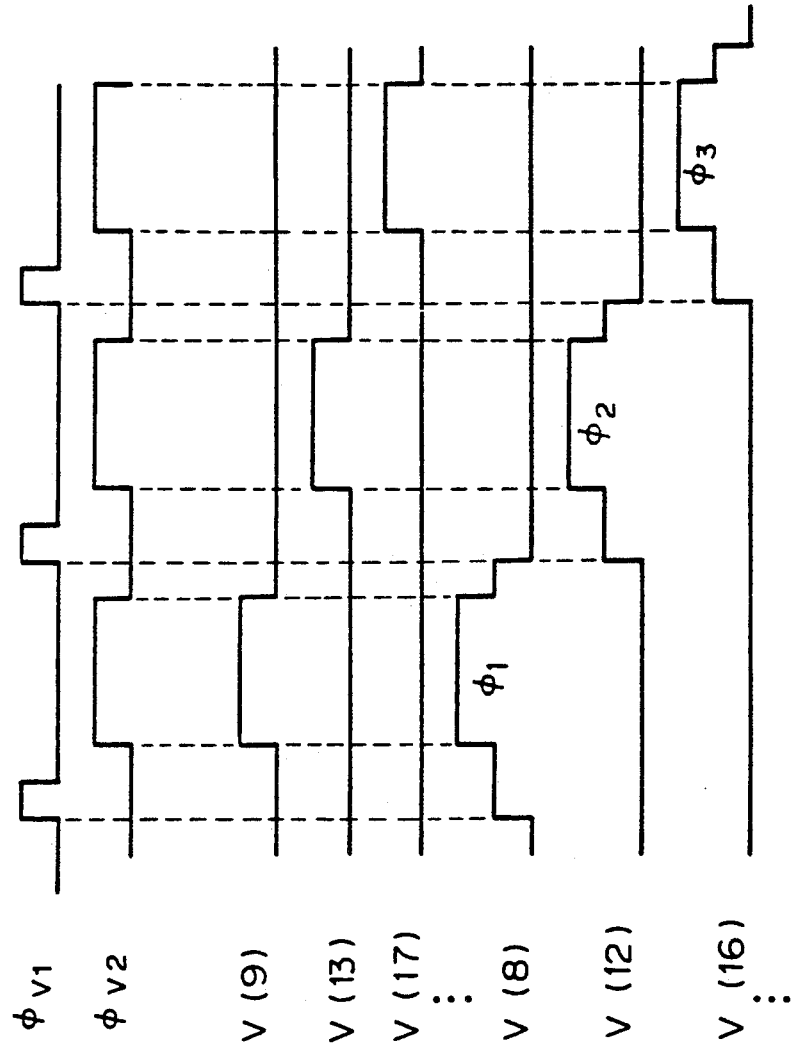

SCAN CIRCUIT WITH BOOTSTRAP DRIVE

This application is a division of application Ser. No. 196,479 filed May 20, 1988 now U.S. Pat. No. 4,922,138.

BACKGROUND OF THE INVENTION

1. Field of the Invention

The present invention relates to a scan circuit in which a plurality of unit circuits are connected and scan pulses are sequentially output from the unit circuits in response to drive pulses.

2. Related Background Art

FIG. 1 is a schematic circuit diagram of a drive section in a solid state image pickup apparatus using a conventional scan circuit.

In the diagram, respective output terminals of a scan circuit 401 are connected to horizontal lines $HDL_1$, $HDL_2$, and $HDL_3$, and to horizontal lines $HDL_3$, $HDL_4$, $HDL_5$, ... through transistors $Qy_1$ to $Qy_4$.

A signal $F_1$ to select odd number fields is input to gate electrodes of the transistors $Qy_1$ and $Qy_2$. A signal $F_2$ to select even number fields is input to gate electrodes of the transistors $Qy_3$ and $Qy_4$. Namely, the transistors $Qy_1$ to $Qy_4$ constitute an interlacing circuit.

When the signal $F_1$ is input, scan pulses $Oy_1$, $Oy_2$, ... are sequentially output to the horizontal lines $HDL_1$ and $HDL_2$, horizontal lines $HDL_3$, and $HDL_4$, ... through the transistors $Qy_1$ and $Qy_2$.

On the other hand, when the signal $F_2$ is input, the scan pulses $Qy_1$, $Qy_2$, ... are sequentially output to the horizontal lines $HDL_2$ and $HDL_3$, the $HDL_4$ and $HDL_5$, ... through the transistors $Qy_3$ and $Qy_4$.

However, in the foregoing image pickup apparatus using the conventional scan circuit, the signals F and $F_2$ are transferred to the horizontal lines HDL through the transistors $Qy_1$ and $Qy_2$ and the transistors $Qy_3$ and $Qy_4$ of the interlacing circuit. Therefore, there are problems such that a voltage drop due to a threshold value voltage Vth of the transistor Qy occurs and the dynamic range is narrowed, so that the picture quality deteriorates.

To solve this problem, in Japanese Patent Gazette No. 61-61586, a vertical buffer circuit to compensate a voltage level of the scan pulse Oy is provided. However, since the buffer circuit is separately provided, the number of elements constituting the vertical scan circuit increases and also the buffer circuit has a bootstrap capacitance. Thus, there is a problem such that it is difficult to reduce the area of the elements.

On the other hand, since two horizontal lines are simultaneously driven, the conventional drive circuit cannot be used in the image pickup devices in which a signal is readout by every one vertical line. Namely, the conventional constitution has problems such that there is a limitation in driving manner and this constitution can be applied to only the limited driving method.

SUMMARY OF THE INVENTION

It is an object of the present invention to provide a scan circuit which can output scan pulses of an enough high level without providing any special circuit to compensate a voltage level of the scan pulses.

According to one embodiment of the present invention, there is provided a scan circuit in which a plurality of unit circuits are connected and scan pulses are sequentially output from the unit circuits in response to drive pulses, wherein a potential at an output terminal of the unit circuit is raised by one drive pulse and the potential at the output terminal is further increased by use of the bootstrap effect by another drive pulse, thereby forming the scan pulses.

In this manner, since the scan pulse at a high voltage can be output by use of the bootstrap effect, the voltage drop by the interlacing circuit or the like can be sufficiently compensated. Any special compensating circuit like the conventional circuit is unnecessary. The constitution of the circuit can be simplified and the area of the devices can be easily reduced.

On the other hand, according to another embodiment of the invention, there is provided a drive circuit of a solid state image pickup apparatus for supplying a drive signal to a plurality of drive lines to drive image pickup elements, wherein a switching means are provided for each output of the scan circuit and the drive signals can be supplied to desired drive lines through the switching means, and the drive signals can be supplied to the drive lines in a desired mode by a desired combination of the scan output of the scan circuit and the drive signals.

With this constitution, even when a plurality of drive lines are scanned, each line can be independently driven and various kinds of driving modes such as interlacing scan, non-interlacing scan, and the like of a plurality of lines can be easily realized.

The above and other objects and features of the present invention will become apparent from the following detailed description and the appended claims with reference to the accompanying drawings.

BRIEF DESCRIPTION OF THE DRAWINGS

FIG. 2B is a voltage waveform diagram in the respective sections for explaining the operation of the embodiment;

DETAILED DESCRIPTION OF THE PREFERRED EMBODIMENTS

An embodiment of the present invention will be described in detail hereinbelow with reference to the drawings.

Figure 2A:
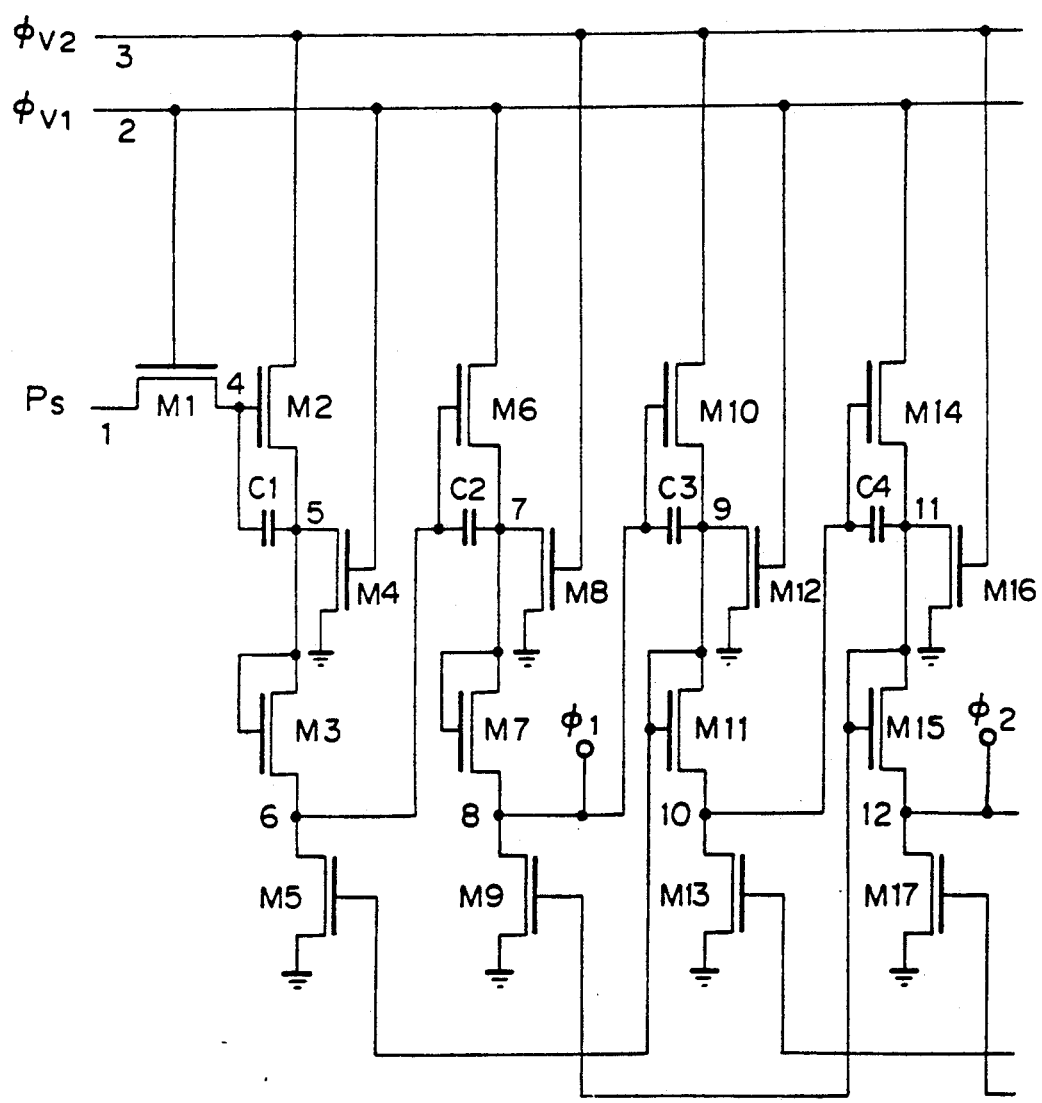
FIG. 2A is a partial circuit diagram in the first embodiment of a scan circuit according to the present invention.

FIG. 2A is a partial circuit diagram of the first embodiment of a scan circuit according to the invention. FIG. 2B is a voltage waveform diagram in the respective sections for explaining the operation of the embodiment.

In this embodiment, n unit circuits are connected and scan pulses $\phi_1$ to $\phi_n$ are sequentially output from the unit circuits. It is assumed that a potential of each section in FIG. 2A is expressed like $V(i)$ using the number (i) added to each section.

In the diagrams, in the unit circuit at the first stage, when a pulse $\phi_{v1}$ rises after a pulse $P_s$ was applied, a transistor $M_1$ is made conductive and the potential $V(4)$ rises. Since the potential $V(4)$ is the gate potential of a transistor $M_2$, the transistor $M_2$ shows a conductance corresponding to the potential $V(4)$.

Subsequently, when the pulse $\phi_{v1}$ falls and a pulse $\phi_{v2}$ rises, the potential $V(5)$ increases through the transistor $M_2$. The increase in the potential $V(5)$ is fed back to a gate of the transistor $M_2$ via a capacitor $C_1$, thereby increasing the potential $V(4)$ due to the bootstrap effect. The increase in the potential $V(4)$ acts so as to raise a conductance of the transistor $M_2$. Therefore, the pulse $\phi_{v2}$ passes, while a voltage drop hardly occurs due to the transistor Mhd 2. This pulse is transmitted through a transistor $M_3$, thereby increasing the potential $V(6)$.

Since the potential $V(6)$ is the gate potential of a transistor $M_6$, a conductance of the transistor $M_6$ rises in correspondence to the potential $V(6)$.

When the pulse $\phi_{v1}$ subsequently rises, the potential $V(7)$ increases through the transistor $M_6$. The potential $V(6)$ further rises due to the bootstrap effect owing to the increase in the potential $V(7)$. Since the increase in the potential $V(6)$ acts so as to enhance the conductance of the transistor $M_6$, the pulse $\phi_{v1}$ allows the potential $V(8)$ to be raised through the transistors $M_6$ and $M_7$ (refer to FIG. 2B). Therefore, a transistor $M_{10}$ exhibits the conductance corresponding to the gate potential $V(8)$.

Next, when the pulse $\phi_{v2}$ rises, the transistor $M_8$ is turned on and the potential $V(7)$ is reset to the earth potential and the transistor $M_7$ is turned off. Thus, the portion of the potential $V(8)$ is set into the floating state.

At the same time, since the pulse $\phi_{v2}$ rises, the potential $V(9)$ rises through the transistor $M_{10}$. The increases in the potential $V(9)$ further increases the potential $V(8)$ by the bootstrap effect.

If such a change in the potential $V(8)$ is used as a scan pulse $\phi$hd 1, a scan pulse at a high voltage can be obtained.

Next, the potential $V(8)$ is reset by the pulse $\phi_{v1}$ and at the same time, the potential $V(12)$ rises and, further, increases by the subsequent pulse $\phi_{v2}$. The potential $V(12)$ is used as a scan pulse $\phi_2$. In a manner similar to the above, scan pulses $\phi_3$ to $\phi_n$ at a high voltage level are successively output synchronously with the pulses $\phi_{v2}$.

In FIG. 2B, by properly setting the timings for the drive pulses $\phi_{v1}$ and $\phi_{v2}$, the waveforms of the scan pulses $\phi_1$ to $\phi_n$ can be made approach a square shape.

Figure 3:
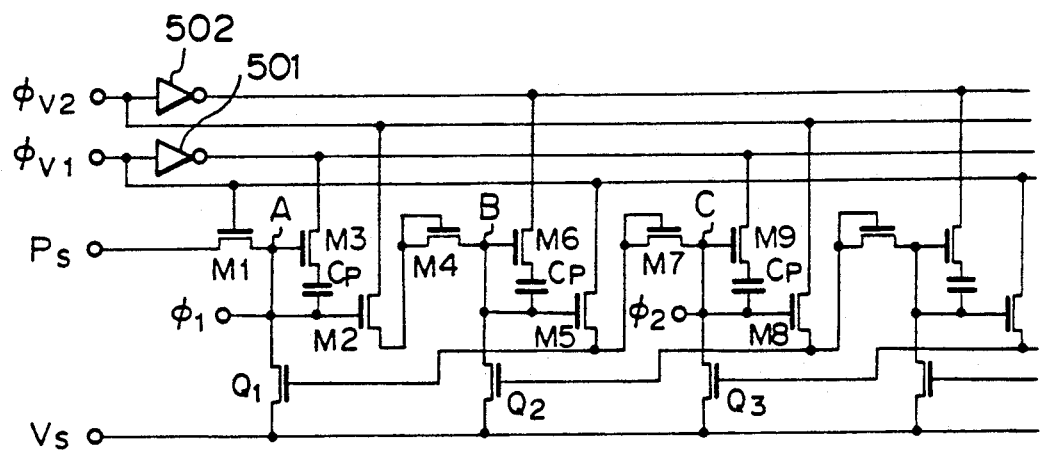
FIG. 3 is a partial circuit diagram of the second embodiment of the invention.
Figure 4:
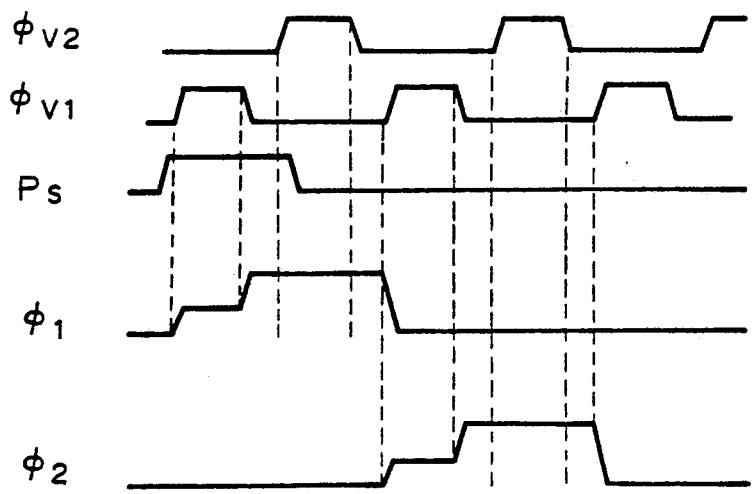
FIG. 4 is a voltage waveform diagram for explaining the operation of the circuit in FIG. 3.

FIG. 3 is a partial circuit diagram of the second embodiment of the invention. FIG. 4 is a voltage waveform diagram for explaining the operation thereof.

In this embodiment, first, the transistor $M_1$ is turned on and the potential $V(A)$ rises by the start pulse $P_s$ and drive pulse $\phi_{v1}$. Thus, the transistors Mhd 2and $M_3$ exhibit a certain conductance.

Subsequently, since the drive pulse $\phi v1$ falls, an output of an inverter 501 rises. Consequently, a voltage is applied to a capacitor $C_p$ through the transistor $M_3$ and the potential $V(A)$ further rises by the bootstrap effect.

Therefore, if such a change in the potential $V(A)$ is used as a scan pulse $\phi_1$, the scan pulse at a high voltage can be derived in a manner similar to the first embodiment. In a manner similar to the above, scan pulses $\phi_2$ to $\phi_n$ at a high voltage level can be successively output synchronously with the drive pulses $\phi_{v1}$ and $\phi_{v2}$.

Figure 1:
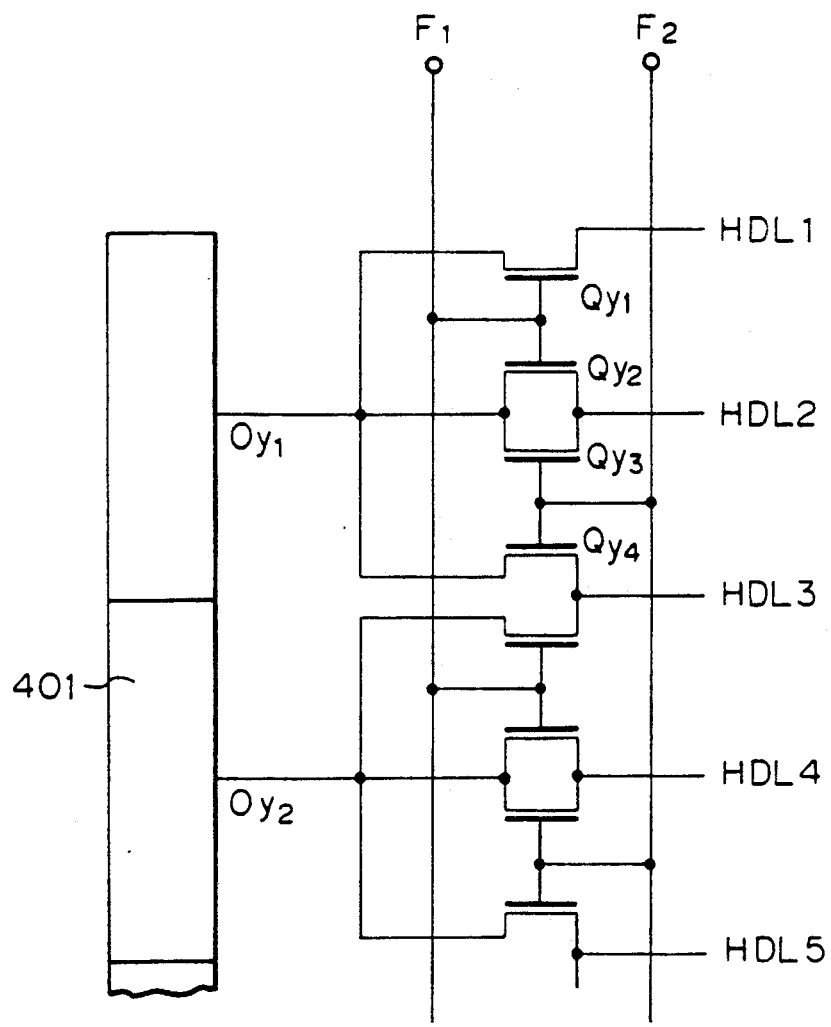
FIG. 1 is a schematic circuit diagram of a drive section in a solid state image pickup apparatus using a conventional scan circuit.

Therefore, even when the interlacing circuit shown in FIG. 1 is provided, the voltage drop can be sufficiently compensated and the high level drive voltage can be transferred to the horizontal lines HDL.

Figure 5:
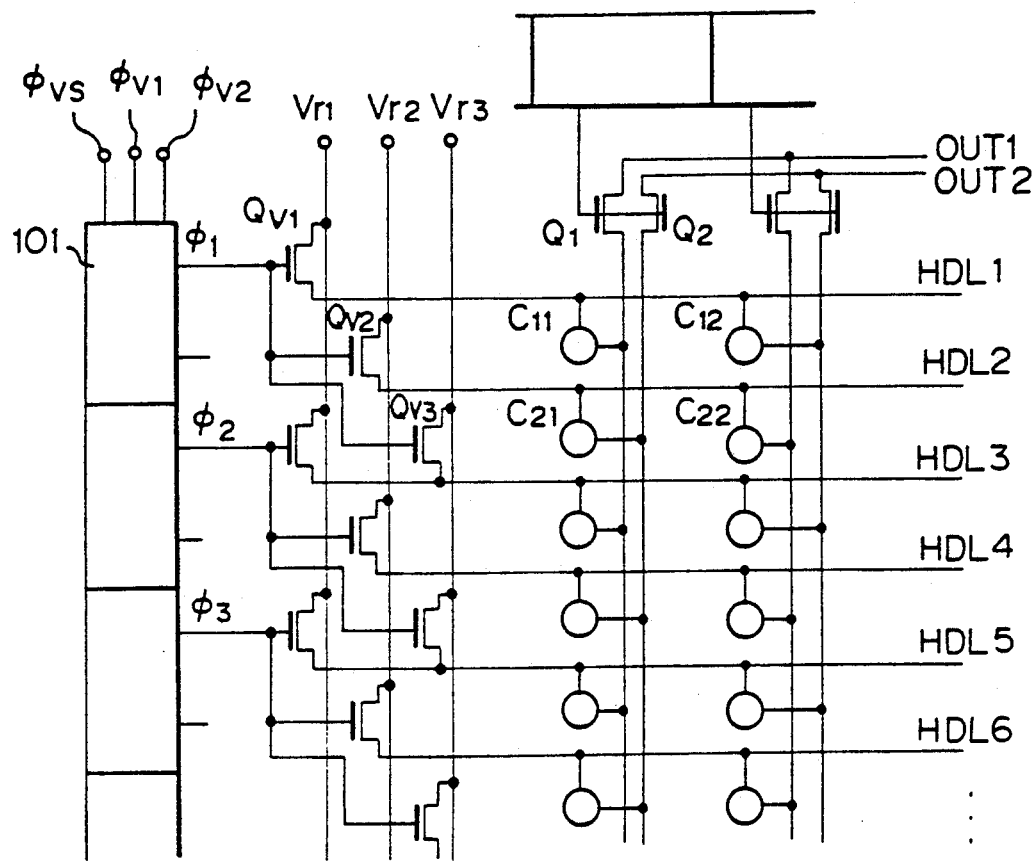
FIG. 5 is a schematic circuit diagram of a drive section using a scan circuit of the embodiment.
Figure 6:
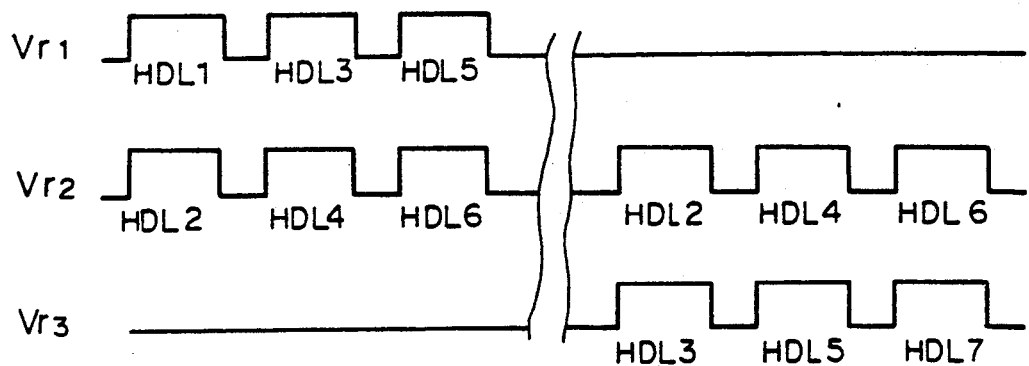
FIG. 6 is a timing chart for explaining the operation of the drive section of FIG. 5.

FIG. 5 is a schematic circuit diagram of a drive section using the scan circuit of the embodiment. FIG. 6 is a timing chart for explaining the operation thereof.

As shown in FIG. 5, the image pickup device comprises photoelectric converting cells $C_{11}$, $C_{12}$, . . . and the like which are arranged like an area and driven every row by the horizontal lines $HDL_1$, $HDL_2$, $HDL_3$, . . . The photoelectric conversion signals are read out through the vertical lines and transistors $Q_1$ and $Q_2$.

In this embodiment, gate electrodes of three transistors $Q_{v1}$ to $Q_{v3}$ are connected to output terminals of a scan circuit 101, respectively.

Each transistor $Q_{v1}$ transfers a drive voltage $V_{r1}$ to the horizontal lines $HDL_1$, $HDL_3$, $HDL_5$, . . . Each transistor $Q_{v2}$ transfers a drive voltage $V_{r2}$ to the horizontal lines $HDL_2$, $HDL_4$, $HDL_6$, . . . Each transistor $Q_{v3}$ transfers a drive voltage $V_{r3}$ to the $HDL_3$, $HDL_5$, $HDL_7$, . . .

In such a circuit arrangement, the scan circuit 101 sequentially outputs the scan pulses $\phi_1$, $\phi_2$, . . . in response to pulses $\phi_{v1}$ and $\phi_{v2}$. Therefore, by applying the drive voltages $V_{r1}$ to $V_{r3}$ by a proper combination, the image pickup device can be scanned in a desired mode.

For example, as shown in FIG. 6, by applying the drive voltage $V_{r1}$ and $V_{r2}$ in the odd number fields, the horizontal lines $HDL_1$ and $HDL_2$, and $HDL_3$ and $HDL_4$, . . . are driven and by applying the drive voltage $V_{r2}$ and $V_{r3}$ in the even number fields, the $HDL_2$ and $HDL_3$, and $HDL_4$ and $HDL_5$, . . . are driven. In this manner, the interlacing scan of the two line driving type can be accomplished.

On the other hand, if the drive voltages $V_{r1}$ and $V_{r2}$ and the drive voltages $V_{r2}$ and $V_{r3}$ are applied at different timings which are deviated from each other, the vertical line of the image pickup device can be also set to a single vertical line.

Even when such a vertical buffer circuit is provided, since the output of the scan circuit 101 according to the embodiment is set to the high voltage level, the transistors $Q_{v1}$ to $Q_{v3}$ can be set to enough high conductances. The drive voltages $V_{r1}$ to $V_{r3}$ can be transferred to the horizontal lines HDL without reducing the drive voltages $V_{r1}$ to $V_{r3}$.

Figure 7:
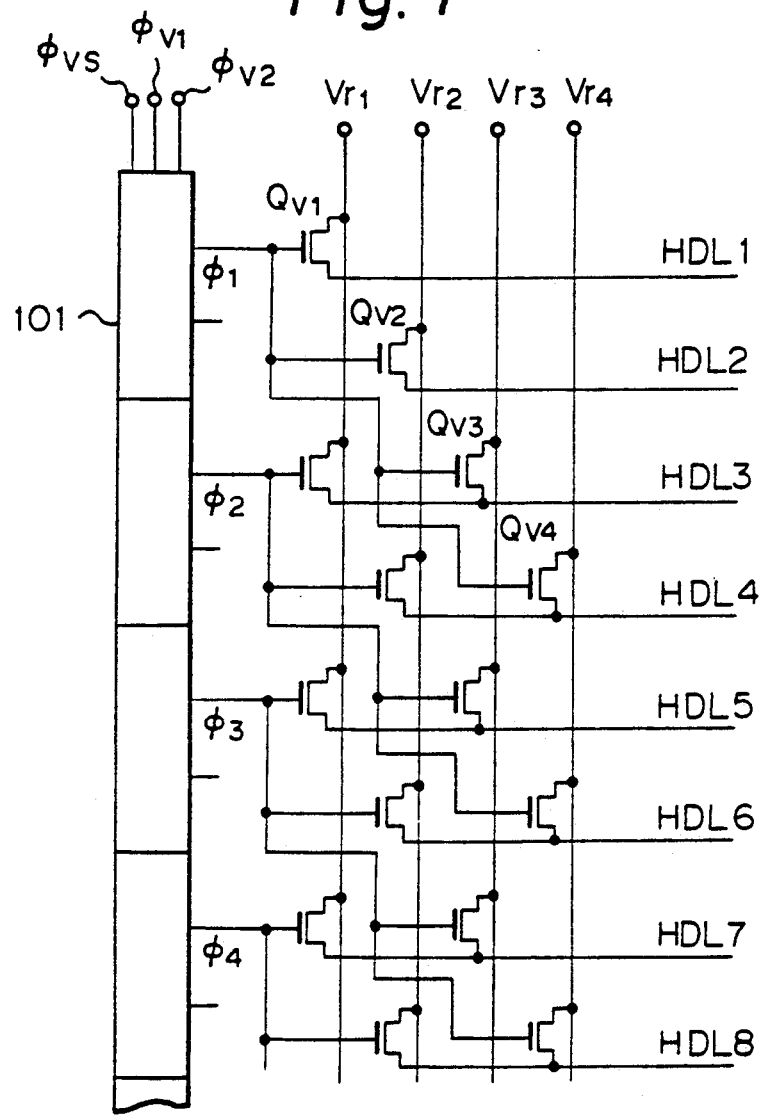
FIG. 7 is a schematic circuit diagram of another example of a drive section using the scan circuit of the embodiment.
Figure 8:
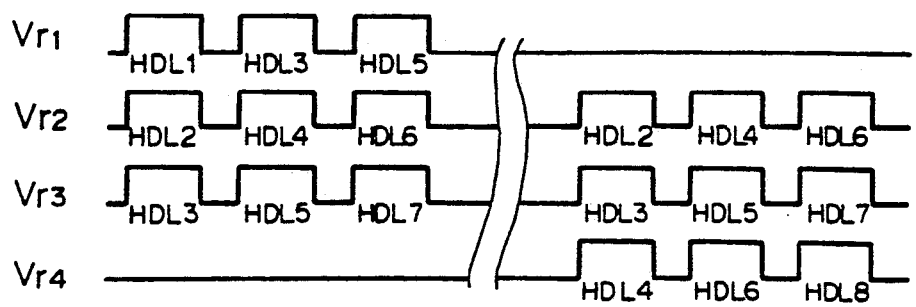
FIG. 8 is a timing chart for explaining the operation of the drive section of FIG. 7.

FIG. 7 is a schematic circuit diagram of another example of a drive section using the scan circuit of the embodiment. FIG. 8 is a timing chart for explaining the operation thereof.

In this manner, by providing the transistors $Q_{v1}$ to $Q_{v4}$ at the respective output terminals of the scan circuit 101 and by combining the drive voltages $V_{r1}$ to $V_{r4}$ as shown in the timing chart, the interlacing scan of the three-line driving type can be also accomplished.

A practical example of a solid state image pickup apparatus using the embodiment will now be explained.

Figure 9:
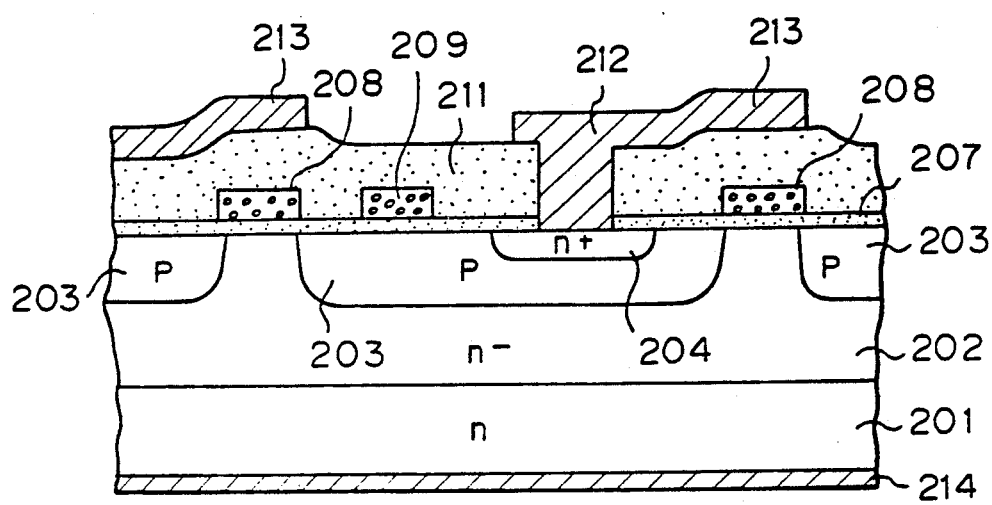
FIG. 9 is a schematic cross sectional view showing an example of a photoelectric converting cell which is used in a solid state image pickup apparatus.

FIG. 9 is a schematic cross sectional view of an example of photoelectric converting cells which are used in the solid state image pickup apparatus.

In the diagram, an $n^-$ layer 202 serving as a collector region is formed on an n type silicon substrate 201 by the epitaxial growth. A p base region 203 is formed in the $n^-$ layer 202. An $n^+$ emitter region 204 is further formed in the p base region 203. In this manner, a bipolar transistor is constituted.

The p base region 203 is two-dimensionally arranged. The cells in the horizontal direction are separated from the cells in the vertical direction by a device separating region. Although not shown, the device separating region comprises an oxide film formed by the LOCOS oxidation and an $n^+$ region formed under the oxide film.

On the other hand, a gate electrode 208 is formed between horizontally neighboring p base regions 203 through an oxide film 207. Therefore, a p channel MOS transistor in which the adjacent p base regions 203 are used as source and drain regions is constituted.

This MOS transistor is the normally OFF type and is set to the OFF state when the potential of the gate electrode 208 is the earth potential or positive potential. Therefore, the p base regions 203 between the adjacent cells are electrically isolated. On the contrary, when the potential of the gate electrode 208 is a negative potential which exceeds a threshold value potential $V_{th}$, the MOS transistor is set to the ON state, so that the p base regions 203 of the respective cells are mutually made conductive.

The gate electrodes 208 are commonly connected to the drive line every row in the horizontal direction. Further, capacitors 209 to control the potentials of the p base regions 203 are also similarly connected to the drive line. The drive line extends in the horizontal direction on the oxide film serving as the device separating region.

Further, after a transparent insulative layer 211 was formed, an emitter electrode 212 is formed. The emitter electrodes 212 are connected to a vertical line 213 every column. A collector electrode 214 is formed on the back surface of the substrate 201 through an ohmic contact layer.

Figures 10A, 10B:
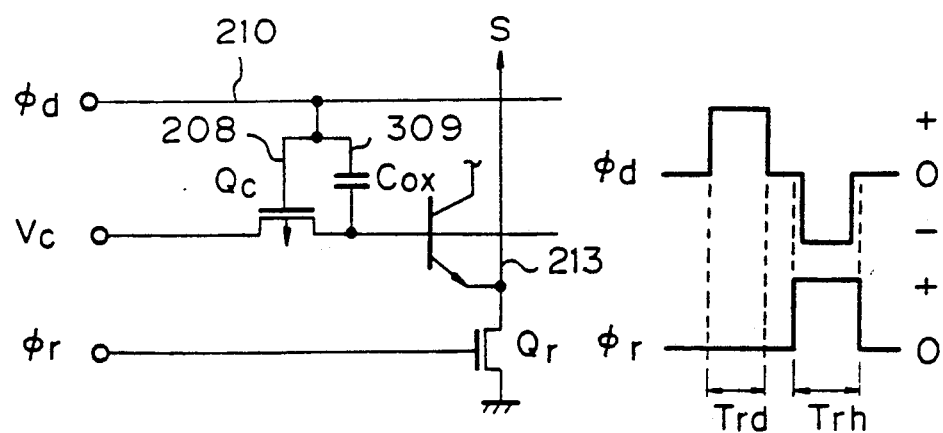
FIG. 10A is an equivalent circuit diagram of the photoelectric converting cell.
FIG. 10B is a voltage waveform diagram for explaining the operation of the circuit of FIG. 10A.

FIG. 10A is an equivalent circuit diagram of the photoelectric converting cell. FIG. 10B is a voltage waveform diagram for explaining the operation thereof.

It is now assumed that carriers (in this case, holes) as much as the incident light amount are accumulated in the p base region 203. It is also assumed that a negative voltage $V_c$ is applied to a terminal of a transistor $Q_c$ and a positive voltage is applied to the collector electrode 214.

In this state, pulses $\phi_d$ of a positive voltage are applied to a drive line 210 for only a period of time $T_{rd}$. Thus, the potential of the p base region 203 rises through a capacitor $C_{ox}$ and the signal is read out to the emitter electrode 212 as mentioned above.

Subsequently, pulses $\phi_d$ of a negative voltage are applied to the drive line 210 for only a period of time $T_{rh}$. Thus, the p channel MOS transistor $Q_c$ is turned on and the base potential is reset to the voltage $V_c$ and the refreshing operation is completely performed. On the other hand, by setting a pulse $\phi_r$ to the high level, the transistor $Q_r$ is turned on, thereby resetting the vertical line 213.

As already mentioned above, as the refreshing operation, after the MOS transistor $Q_c$ was turned on, the pulse $\phi_d$ of a positive voltage can be also applied while the emitter electrode 212 is grounded. In this case, there is no need to set the voltage $V_c$ to a negative voltage but can be set to the earth voltage or positive voltage.

After completion of the foregoing refreshing operation, the accumulating operation is started. The similar operations are repeated hereinafter.

Figure 11:
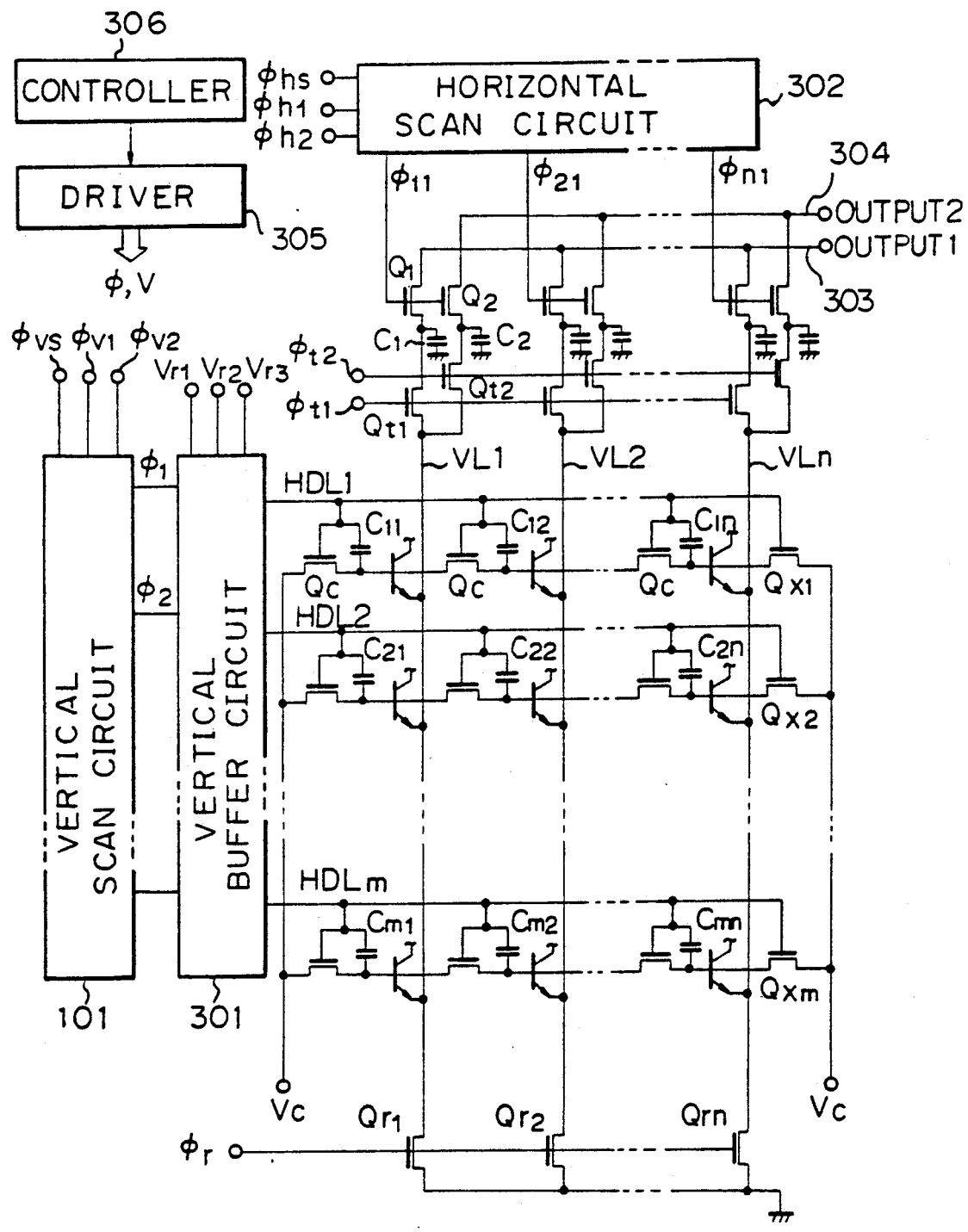
FIG. 11 is a schematic circuit diagram of the image pickup apparatus using the photoelectric converting cell.

FIG. 11 is a schematic circuit diagram of an image pickup apparatus using the foregoing photoelectric converting cells.

In this apparatus, m × n photoelectric converting cells are arranged like an area.

In the cells $C_{11}$ to $C_{1n}$, $C_{21}$ to $C_{2n}$, . . . on the horizontal lines, the gate electrodes 208 of the MOS transistor $Q_c$ are commonly connected to the drive lines $HDL_1$ to $HDL_m$, respectively.

The drive lines $HDL_1$ to $HDL_m$ are connected to a vertical buffer circuit 301. The scan pulses $\phi_1$ to $\phi_m$ are input to the vertical buffer circuit 301 from the vertical scan circuit 101 as the embodiment.

The MOS transistors $Q_c$ in each of which the p base regions 203 in each cell are used as source and drain regions are serially connected every horizontal line. The p regions to form the MOS transistor $Q_c$ are respectively formed in the cells $C_{11}$ to $C_{m1}$ arranged at the edge line. On the other hand, MOS transistors $Q_{x1}$ to $Q_{xm}$ are respectively serially connected to the cells $C_{1n}$ to $C_{mn}$. A constant voltage $V_c$ is applied to both ends.

The emitter electrodes in the cells $C_{11}$ to $C_{m1}$, $C_{12}$ to $C_{m2}$, . . . in the vertical direction are commonly connected to vertical lines $V_{L1}$ to $V_{Ln}$, respectively. The vertical lines are grounded through reset transistors $Q_{r1}$ to $Q_{rn}$. A reset pulse $\phi_r$ is commonly input to the gate electrodes of the transistors $Q_{r1}$ to $Q_{rn}$.

The vertical lines $VL_1$ to $VL_n$ are connected to capacitors $C_1$ and $C_2$ through transistors $Q_{t1}$ and $Q_{t2}$, respectively. The pulses $\phi_{t1}$ and $\phi_{t2}$ are input to the gate electrodes of the transistors $Q_{t1}$ and $Q_{t2}$.

Further, the capacitors $C_1$ and $C_2$ are connected to signal lines 303 and 304 through the transistors $Q_1$ and $Q_2$, respectively. Scan pulses $\phi_{l1}$ to $\phi_{nl}$ of a horizontal scan circuit 302 are input to the gate electrodes of the transistors $Q_1$ and $Q_2$, respectively.

Various kinds of pulses $\phi$, voltages V, and the like to drive the image pickup apparatus are supplied from a driver 305. The driver 305 is controlled by a controller 306.

Figure 12:
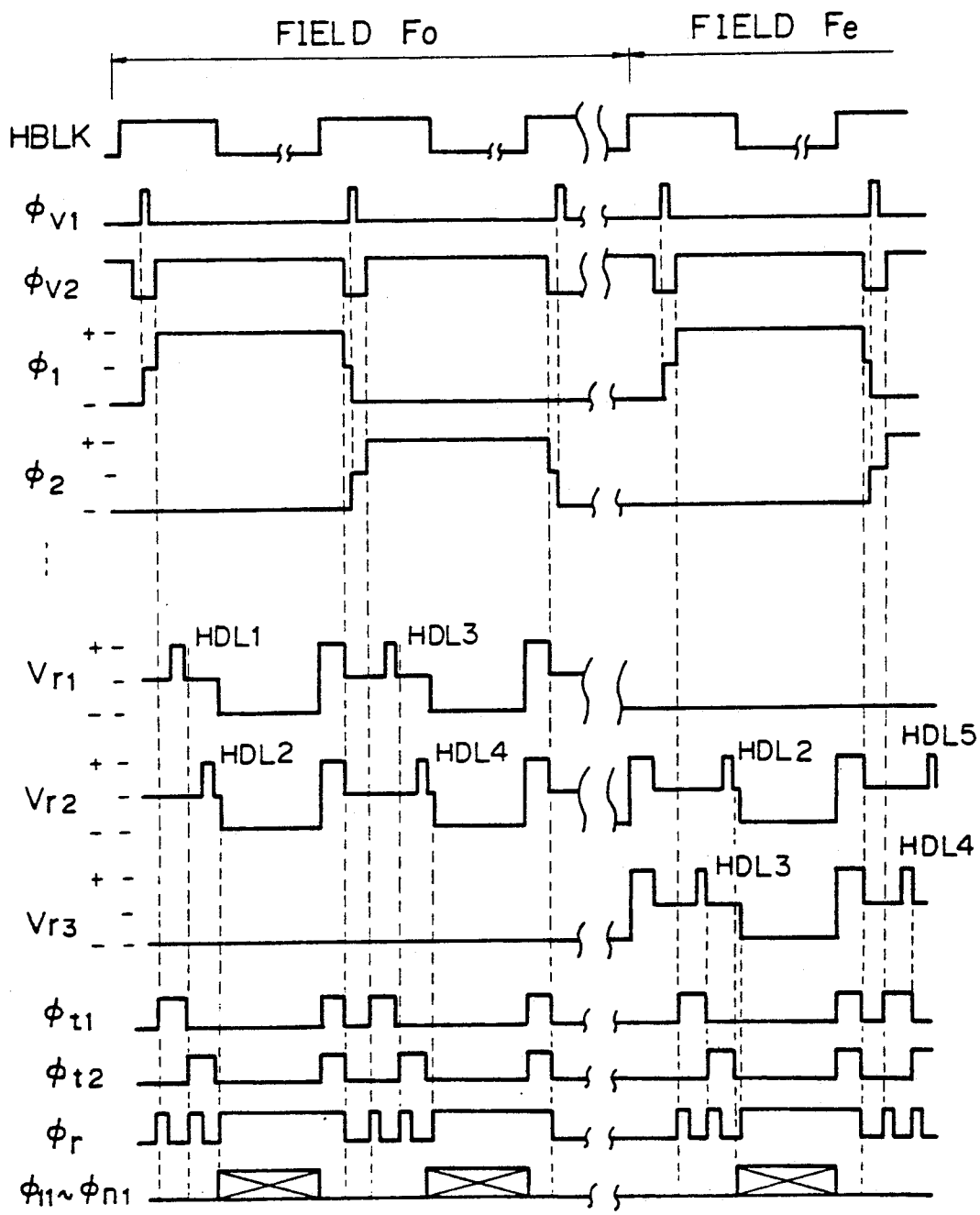
FIG. 12 is a timing chart for schematically explaining the operation of the image pickup apparatus of FIG. 11.

FIG. 12 is a timing chart for schematically explaining the operation of the image pickup apparatus.

In the odd number fields $F_o$, when the pulses $\phi_{v1}$ and $\phi_{v2}$ are input to the vertical scan circuit 101, the scan pulse $\phi_1$ rises. The scan pulse $\phi_1$ is set to the high voltage since it uses the bootstrap effect as mentioned above.

Thus, the vertical buffer circuit 301 outputs input voltages $V_{r1}$ and $V_{r2}$ to the horizontal lines $HDL_1$ and $HDL_2$, respectively.

Simultaneously with the rising of the pulse $\phi_{v2}$, the pulses $\phi_{t1}$ and $\phi_r$ rise and the transfer transistor $Q_{t1}$ and reset transistor $Q_r$ are turned on, thereby clearing the vertical lines VL and capacitor $C_1$.

Subsequently, after the reset transistor $Q_r$ was turned off, the input voltage $V_{r1}$ is set to a positive voltage and the reading operations of the cells $C_{1l}$ to $C_{1n}$ on the horizontal line $HDL_1$ are executed. The readout signals are stored into the capacitor $C_1$ through the transfer transistor $Q_{t1}$, respectively.

Next, when the pulses $\phi_{t2}$ and $\phi_r$ rise, the transfer transistor $Q_{t2}$ and reset transistor $Q_r$ are turned on, thereby clearing the capacitor $C_2$ and vertical lines VL.

Subsequently, the input $V_{r2}$ is set to a positive voltage and the reading operations of the cells $C_{21}$ to $C_{2n}$ on the horizontal line $HDL_2$ are executed. The readout signals are stored into the capacitor $C_2$ through the transfer transistor $Q_{t2}$.

The foregoing operations are performed within a horizontal blanking period HBLK. Next, the sensor signals of the first and second rows which were accumulated in the capacitors $C_1$ and $C_2$ within the effective horizontal period are scanned and output.

Namely, the transistors $Q_1$ and $Q_2$ are sequentially turned on by the scan pulses $\phi_{l1}$ to $\phi_{n1}$ which are successively output from the horizontal scan circuit 302. The signals stored in the capacitors $C_1$ and $C_2$ are read out and output to the signal lines 303 and 304.

In parallel with those operations, the pulse $\phi_r$ rises and the transistor $Q_r$ is turned on, thereby grounding the vertical lines VL. On the other hand, the input voltages $V_{r1}$ and $V_{r2}$ are set to a negative voltage, thereby refreshing the cells of the first and second rows. That is, the MOS transistor $Q_c$ of each cell are turned on and each base potential is set to a constant value.

Next, the input voltages $V_{r1}$ and $V_{r2}$ are set to a positive voltage, thereby refreshing the base regions 203 which were reset to a constant potential. In other words, since the emitter electrodes of the cells are grounded through the vertical lines VL, when a positive voltage is applied to capacitors $C_{ox}$, the circuit between the base and emitter is forwardly biased, so that the carriers accumulated in the base region 203 are extinguished in a manner similar to the reading operations.

After completion of the refreshing operation in this manner, the cells of the first and second rows start the accumulating operation.

In a manner similar to the above, the reading and refreshing operations of the third and fourth rows, the fifth and sixth rows, ... in the odd number fields $F_o$ are sequentially executed by the pulses $\phi_{v1}$ and $\phi_{v2}$.

In the even number fields $F_e$, the reading and refreshing operations of the second and third rows, the fourth and fifth rows, ... are successively performed by the input $V_{r2}$ and $V_{r3}$.

By using the scan circuit 101 according to the embodiment of the invention in the drive section of the image pickup apparatus, the good picture quality can be derived without providing any special voltage level compensating circuit or the like.

As explained in detail above, according to the scan circuit of the invention, the scan pulse can be set to a high voltage level by use of the bootstrap effect. Thus, even when the interlacing circuit or the like is provided, the scan can be performed by an enough high voltage.

Thus, there is no need to compensate the output level by adding the bootstrap capacitance as in the conventional apparatus. The circuit constitution is simplified and the area of the elements can be easily reduced.

According to the drive circuit of the invention, since the drive signals are supplied to the drive lines in a desired mode on the basis of the scan output of the scan circuit and a desired combination of the drive signals, even when a plurality of drive lines are scanned, they can be independently driven. Various kinds of driving modes such as interlacing scan, non-interlacing scan, and the like of a plurality of lines can be easily performed.

What is claimed is:

1. A solid state image pickup apparatus comprising:
    a) a plurality of photosensitive cells arranged in a row and column array;
    b) a selecting line to select the photosensitive cells on a predetermined row from among said plurality of photosensitive cells;
    c) scanning means for supplying an address signal to said selecting line, said scanning means having a plurality of stages and output signals being sequentially output one by one from said stages and comprising at least two bootstrap means connected with each other to mix drive pulses whose voltages are raised by said at least two bootstrap means, respectively, at a junction of said at least two bootstrap means to provide the mixed drive pulse as the address signal;
    d) switching means each including three or more switching elements which are connected to outputs of each stage of the scanning means and are controlled, and each of the three or more switching elements of each switching means being connected to a different selecting line, respectively;
    e) another control means different from said scanning means, said another control means being provided to control the operations of said three or more switching elements.

2. An apparatus according to claim 1, wherein the selecting lines controlled by said three or more switching elements connected to a predetermined stage of said scanning means are in overlapping relationship with the selecting lines controlled by the three or more switching elements connected to another stage of said scanning means adjacent to said predetermined stage.

3. An apparatus according to claim 1, wherein said another control means turns on at least two of said switching elements for one image pickup.

4. An apparatus according to claim 1, wherein said scanning means includes a vertical scanning circuit.

5. An image pickup device comprising:
    first scanning means for selecting a plurality of photosensitive cells arranged in a row and column array, by row to output a scanning pulse; and
    second scanning means for selecting said plurality of photosensitive cells by column to output a scanning pulse;
    means for generating drive pulses;
    wherein said first scanning means comprises at least two bootstrap means connected with each other to mix drive pulses whose voltages are raised by said at least two bootstrap means, respectively, at a junction of said two bootstrap means to provide a mixed drive pulse as the scanning pulse.

6. A device according to claim 5, wherein said first scanning means includes means for generating a vertical scanning pulse and said second scanning means includes means for generating a horizontal scanning pulse.

7. A device according to claim 5, wherein the scanning pulse output from said first scanning means is distributed to photosensitive elements of at least two rows, and said at least two rows partially overlap two rows of photosensitive elements to which an another scanning pulse is distributed.

8. A device according to claim 5, wherein the scanning pulse is distributed to at least two rows of photosensitive elements, and signals respectively output from the photosensitive elements of said at least two rows are output through different output lines respectively.

9. A device according to claim 8, wherein said signals output through the output lines are synchronized with each other.

* * * * *

UNITED STATES PATENT AND TRADEMARK OFFICE
CERTIFICATE OF CORRECTION

PATENT NO. : 5,119,202

DATED : June 2, 1992

INVENTOR(S) : SEIJI HASHIMOTO, ET AL.

Page 1 of 2

It is certified that error appears in the above-identified patent and that said Letters Patent is hereby corrected as shown below:

COLUMN 1

Line 24, "$Q_{Y4}$" should read --$Q_{Y4}$.--.
Line 31, "$Q_{Y1}$, $Q_{Y2}$," should read --$O_{Y1}$, $O_{Y2}$,--.
Line 35, "F" should read --$F_1$--.

COLUMN 2

Line 16, "a" should be deleted.

COLUMN 3

Line 32, "Mhd 2." should read --$M_2$.--.
Line 57, "ϕhd 1," should read --$\phi_1$,--.

COLUMN 4

Line 6, "Mhd 2and" should read --$M_2$ and--.

COLUMN 7

Line 30, "are" should read --is--.

COLUMN 8

Line 30, "respectively;" should read --respectively; and--.
Line 50, "and" should be deleted.
Line 53, "pulse;" should read --pulse; and--.

UNITED STATES PATENT AND TRADEMARK OFFICE
CERTIFICATE OF CORRECTION

PATENT NO. : 5,119,202

DATED : June 2, 1992

INVENTOR(S) : SEIJI HASHIMOTO, ET AL.

It is certified that error appears in the above-identified patent and that said Letters Patent is hereby corrected as shown below:

<u>COLUMN 9</u>

Line 1, "an" should be deleted.

Signed and Sealed this

Second Day of November, 1993

Attest:

BRUCE LEHMAN

Attesting Officer  Commissioner of Patents and Trademarks